United States Patent
Blodgett (10) Patent No.: US 7,558,125 B2
(45) Date of Patent: Jul. 7, 2009

(54) INPUT BUFFER AND METHOD WITH AC POSITIVE FEEDBACK, AND A MEMORY DEVICE AND COMPUTER SYSTEM USING SAME

(75) Inventor: Greg Blodgett, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 11/639,452

(22) Filed: Dec. 15, 2006

(65) Prior Publication Data

US 2008/0144398 A1    Jun. 19, 2008

(51) Int. Cl.
*G11C 7/10* (2006.01)
(52) U.S. Cl. .................. 365/189.05; 365/189.07; 365/207; 365/189.08
(58) Field of Classification Search ............ 365/189.05, 365/189.07, 207, 189.08
See application file for complete search history.

(56) References Cited

U.S. PATENT DOCUMENTS

| | | | | |
|---|---|---|---|---|
| 5,793,680 A | * | 8/1998 | Okajima ............... | 365/189.05 |
| 5,939,942 A | * | 8/1999 | Greason et al. ............. | 330/253 |
| 6,335,633 B1 | * | 1/2002 | Kirsch ......................... | 326/34 |
| 6,411,152 B1 | * | 6/2002 | Dobberpuhl ................ | 327/291 |
| 6,864,725 B2 | | 3/2005 | Cowles et al. ............... | 327/108 |
| 2002/0005758 A1 | * | 1/2002 | Iga ............................. | 330/257 |
| 2003/0081473 A1 | * | 5/2003 | Lin ............................. | 365/200 |
| 2005/0168246 A1 | * | 8/2005 | Sharma et al. ................ | 327/78 |

* cited by examiner

*Primary Examiner*—Thong Q Le
(74) *Attorney, Agent, or Firm*—Dorsey & Whitney LLP (57) ABSTRACT

An input buffer having a comparator that receives an input signal, a reference signal and a positive feedback. The comparator compares the input signal relative to the reference signal and generates an output signal transitioning between a first logic state and a second logic state responsive to the magnitude of the input signal transitioning through the magnitude of the reference signal. The comparator intensifies the output signal in response to the positive feedback from the output of the comparator while the output signal transitions from the first logic state to the second logic state.

54 Claims, 6 Drawing Sheets

INPUT BUFFER AND METHOD WITH AC POSITIVE FEEDBACK, AND A MEMORY DEVICE AND COMPUTER SYSTEM USING SAME

TECHNICAL FIELD

This invention relates generally to integrated circuits, and more specifically to an apparatus and method for a comparator circuit that uses AC positive feedback to reduce false switching due to slope reversals of a received signal.

BACKGROUND OF THE INVENTION

Input buffers are commonly used in a wide variety of integrated circuits. Buffers generally perform a number of advantageous functions when used in digital circuits. For example, buffers generally provide a high input impedance to avoid excessively loading circuits to which they are connected, and they have a low output impedance to simultaneously drive electrical circuits without excessive loading. Buffers can condition the signals applied to internal circuits so that the internal signals have well-defined logic levels and transition characteristics. Buffers are used, for example, to couple command, address and write data signals from command, address and data buses, respectively, of memory devices, including dynamic random access memory ("DRAM") devices.

Figure 1:
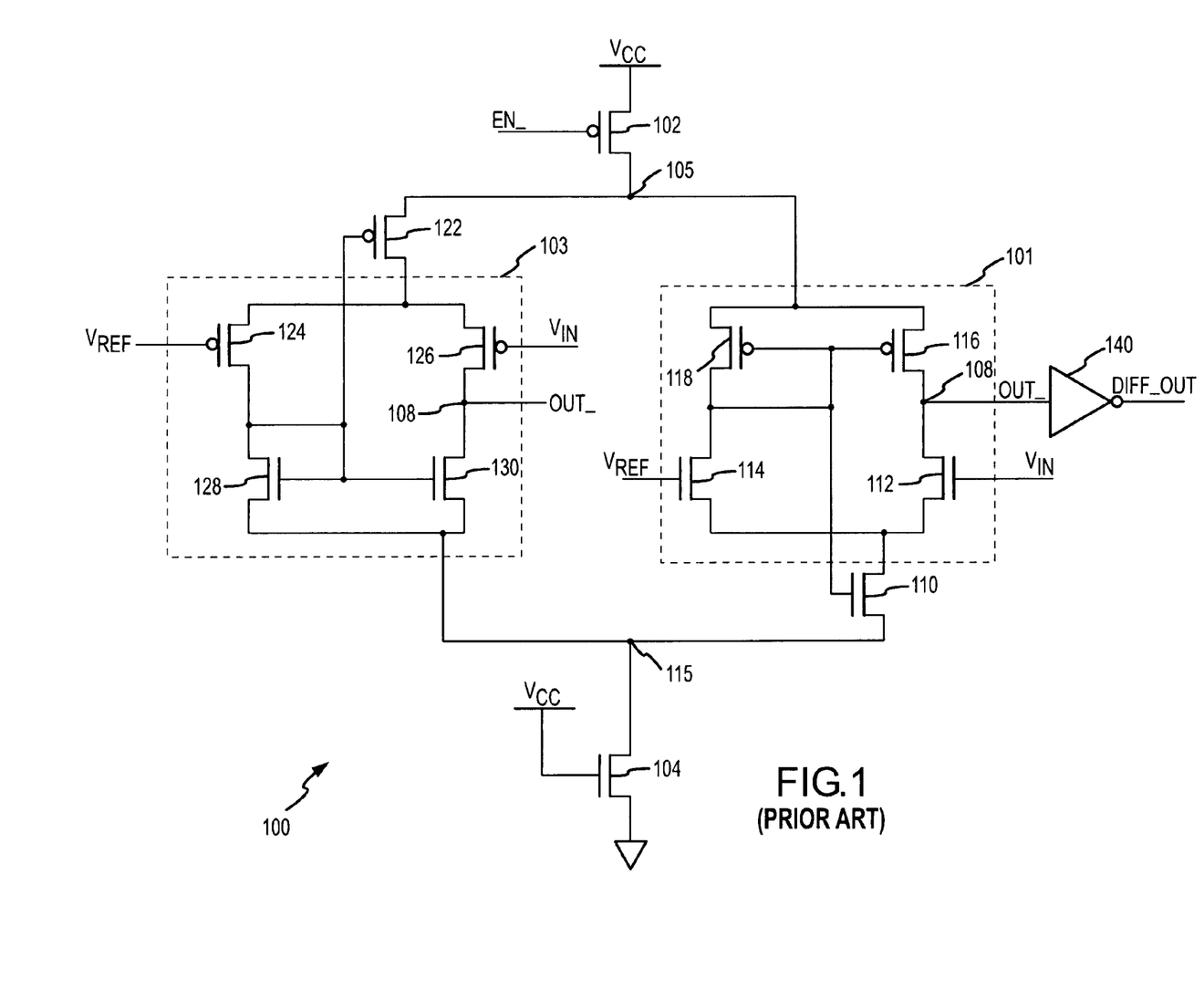
FIG. 1 is a block diagram of a conventional differential input buffer.

There are also several types of input buffers. For example, there are single ended input buffers in which a single input signal is applied to the buffer to cause the buffer to transition when the input signal transitions through predetermined voltage levels. Single-ended input buffers may also be used to compare the input signal to a reference voltage so that when the input signal transitions through the reference voltage the output of the buffer also transitions. Differential input buffer circuits are useful in digital circuits for determining whether an unknown input voltage is either above or below a fixed reference voltage. A conventional differential input buffer 100 is shown in FIG. 1 that includes a pair of differential amplifiers 101, 103, and an output coupled to an inverter 140. The amplifiers 101, 103 are connected in parallel between a PMOS transistor 102 that is coupled to a supply voltage $V_{CC}$ and an NMOS transistor 104 that is coupled to ground. When enabled by an active low signal EN_, the supply voltage $V_{CC}$ supplies a current through the PMOS transistor 102 to a node 105. As a result, a constant current is provided to the amplifier 101 and a PMOS transistor 122 coupled to the amplifier 103. Similarly, the supply voltage $V_{CC}$ is directly coupled to the gate of the transistor 104 such that a constant current is coupled from a node 115 through the transistor 104, thereby drawing current through an NMOS transistor 110 coupled to the amplifier 101 and to the amplifier 103. Therefore, the transistor 122 functions as a current source providing constant current to amplifier 103, and transistor 110 functions as a current sink to discharge a constant current from amplifier 101.

The two differential amplifiers 101, 103 have essentially the same components, but are complementary configured with respect to each other. The differential amplifier 101 includes a pair of PMOS transistors 116, 118 whose gates are coupled to each other and to node 105, and further coupled to the drain of the PMOS transistor 118. The transistors 116, 118 are coupled to each other in a current mirror configuration so they both have the same gate-to-source voltage. As a result, the transistors 116, 118 have the same source-to-drain resistance. The drains of the transistors 116, 118 are coupled to the drains of two NMOS transistors 112, 114 respectively, and receive an input signal $V_{IN}$ and a reference signal $V_{REF}$ at their respective gates. When the magnitude of the $V_{IN}$ signal is at ground potential, the transistor 112 is turned OFF. As a result, an output node 108 at which an OUT_signal is generated is driven high through the PMOS transistor 116. An inverter 140 having an input coupled to the node 108 thus generates a low DIFF_OUT signal. When the magnitude of the $V_{IN}$ signal is at $V_{CC}$, the transistor 112 is turned ON with a significantly higher gate-to-source voltage than the gate-to-source voltage of the PMOS transistor 116. As a result, the resistance of the transistor 112 is significantly lower than the resistance of the transistor 116. The voltage at the output node 108 is therefore low enough so that the inverter 140 outputs a high DIFF_OUT signal. As the magnitude of the $V_{IN}$ signal passes through the magnitude of the $V_{REF}$ signal, which is typically $V_{CC}/2$, the NMOS transistors 112, 114 have the same gate-to-source voltage and hence the same resistance. Furthermore, the NMOS transistors 112, 114 will have the same gate-to-source voltage as the PMOS transistors 116, 118. If the NMOS transistors 112, 114 have the same electrical characteristics as the PMOS transistors 116, 118, the PMOS transistors 116, 118 will then have the same resistance as the NMOS transistors 112, 114. In such case, the OUT_voltage will be equal to $V_{CC}/2$. Therefore, decreasing the magnitude of the $V_{IN}$ signal increases the resistance across the transistor 112, reducing the current through the transistors 112, 116 to cause the magnitude of the OUT_signal to increase. Conversely, increasing the magnitude of the $V_{IN}$ signal decreases the resistance across the transistor 112, increasing the current through the transistors 112, 116 to cause the magnitude of the OUT_signal to decrease.

The amplifier 103 includes components that are the same as the amplifier 101, and thus for the sake of brevity, the components to the amplifier 103 will not be described in detail. The amplifier 103 has a topology that is complementary to the topology of the amplifier 101 so that the gates of NMOS transistors 128, 130 are coupled together in a current mirror configuration so that both transistors 128, 130 have the same resistance. As the magnitude of the $V_{IN}$ signal increases, the resistance of the PMOS transistor 126 increases to cause the magnitude of the OUT_signal to decrease. Conversely, as the magnitude of the $V_{IN}$ signal decreases, the resistance of the PMOS transistor 126 decreases to cause the magnitude of the OUT_signal to increase.

When the magnitude of the $V_{IN}$ signal decreases below $V_T$, where $V_T$ is the threshold voltage of the NMOS transistor 112, the transistor 112 is turned OFF and thus no longer responds to changes in the magnitude of $V_{IN}$. Similarly, when the magnitude of the $V_{IN}$ signal increases above $V_{CC}$-$V_T$, where $V_T$ is the threshold voltage of the PMOS transistor 126, the transistor 126 is turned OFF and thus no longer responds to changes in the magnitude of $V_{IN}$. Thus, the buffer 100 can operate at all values of $V_{IN}$ from 0 to $V_{CC}$, but only one amplifier 101 or 103 is operable with the magnitude of $V_{IN}$ below $V_T$ or above $V_{CC}$-$V_T$.

Figure 2:
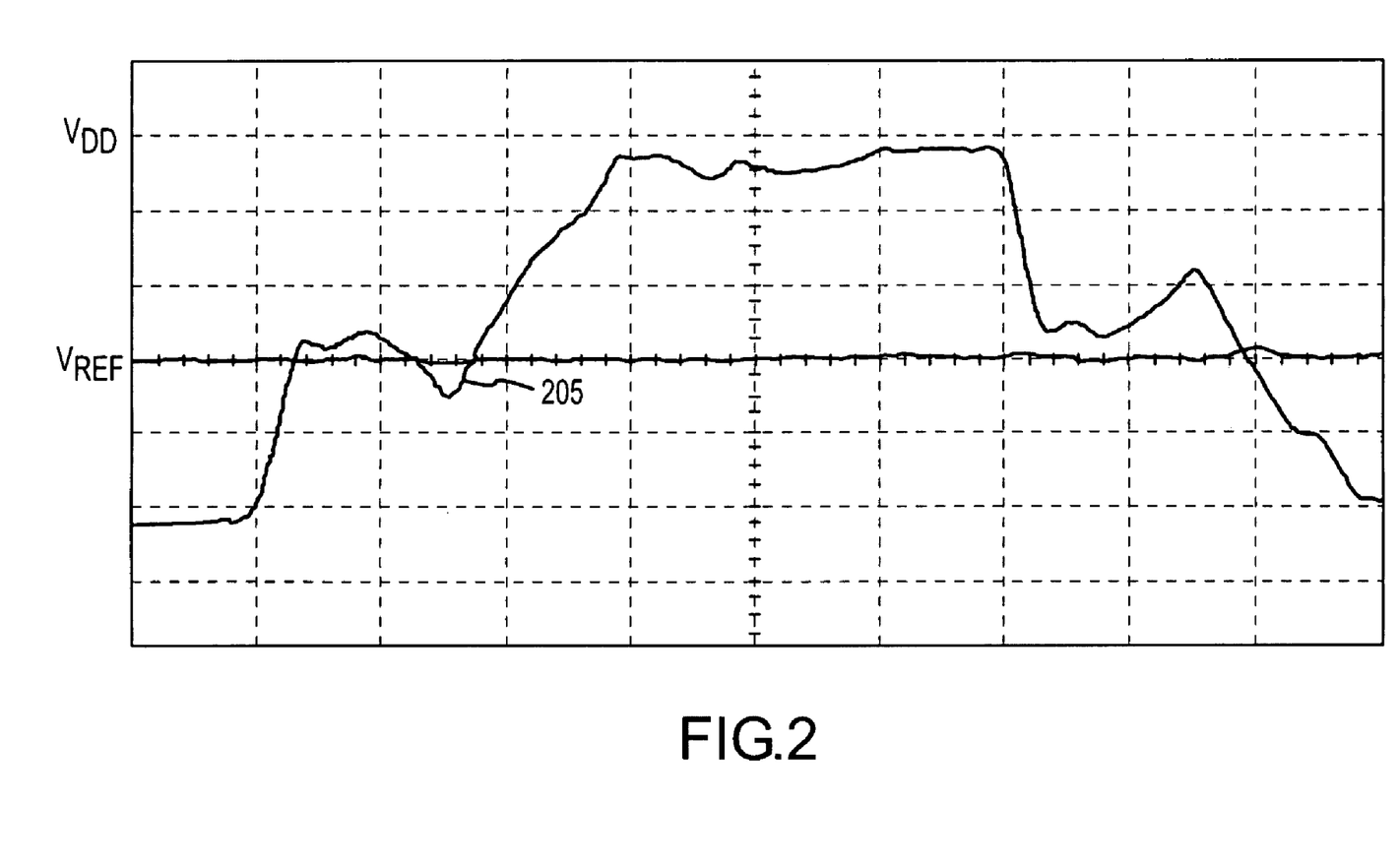
FIG. 2 is a graphical representation of a false switching occurring to an input signal of the input buffer of FIG. 1.

When the difference between $V_{IN}$ and $V_{REF}$ is small, such as when $V_{IN}$ transitions through $V_{REF}$, the integrity of the input signal can be easily compromised by a number of interferences, such as improper bus termination, reflections, signal noise, and $V_{REF}$ noise. These factors can result in false switching of the buffer 100 as shown in FIG. 2. For example, due to the presence of noise, the $V_{REF}$ signal may fluctuate about its predetermined value, such as $V_{CC}/2$. As the $V_{IN}$ signal approaches the $V_{REF}$ signal, the noise interference on the $V_{REF}$ signal may overlap the $V_{IN}$ signal such that a slope reversal 205 occurs, where the buffer 100 detects $V_{REF}$ to be greater than $V_{IN}$, when in fact VIN is intended to be greater than $V_{REF}$, but may not be due to noise and or signal reflections. Consequently, the buffer 100 may falsely switch its output, thereby generating an incorrect response to the input signal and causing delays or resulting in errors to the overall operation of the system or component that relies on the buffer 100.

Therefore, there is a need for a low current input buffer that reduces false switching in the presence of noise due to input signal slope reversals, and restores signal integrity.

DETAILED DESCRIPTION

Embodiments of the present invention are directed to an input buffer with AC positive feedback. Certain details are set forth below to provide a sufficient understanding of the invention. However, it will be clear to one skilled in the art that the invention may be practiced without these particular details. In other instances, well-known circuits, control signals, and timing protocols have not been shown in detail in order to avoid unnecessarily obscuring the invention.

Figure 3:
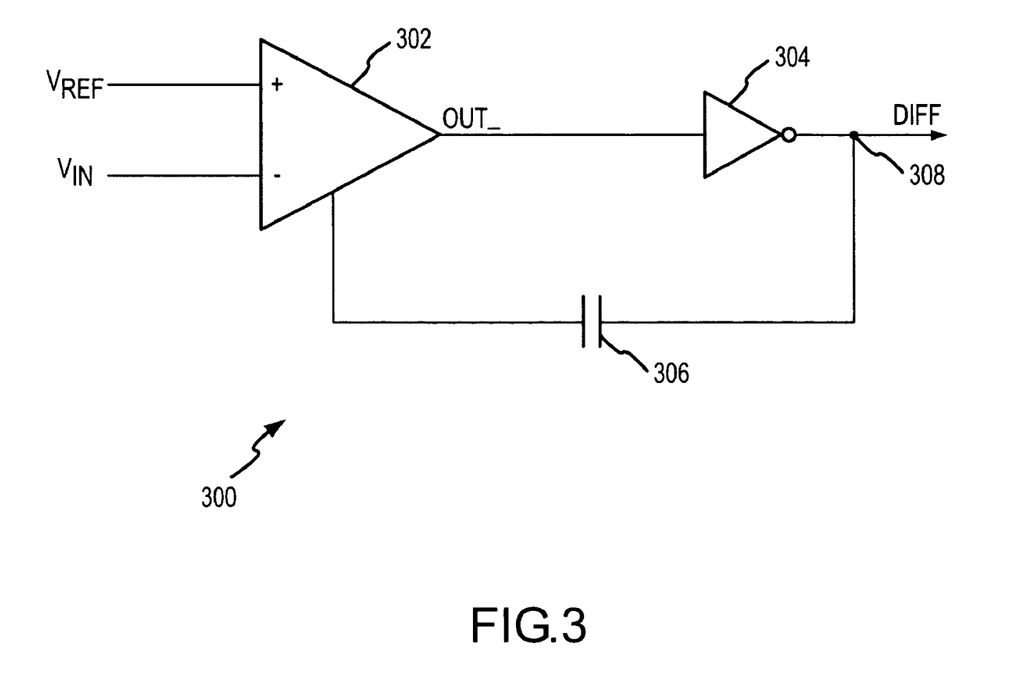
FIG. 3 is a block diagram of a differential input buffer having a capacitor coupled feedback to create AC positive feedback according to an embodiment of the invention.

FIG. 3 shows a block diagram of a buffer 300 according to an embodiment of the invention. The buffer 300 includes a differential comparator 302 that receives an input signal $V_{IN}$ and a reference signal $V_{REF}$. Similarly to the conventional input buffer 100, the comparator 302 of the buffer 300 compares the two input signals and generates an inverted output signal OUT_depending on whether the $V_{IN}$ signal is above or below the reference $V_{REF}$. An inverter 304 drives and inverts the OUT_signal to generate a buffer output signal DIFF. However, as previously described, when the $V_{IN}$ signal approaches the trip point determined as $V_{REF}$, false switching due to input signal slope reversals can occur. In such cases, the buffer 300 reduces false switching by coupling the DIFF signal at a node 308 to the comparator 302, thereby providing positive feedback as the output signal transitions from one logic level to another. The feedback loop includes a capacitor 306 that creates AC positive feedback for a small period of time as it charges and discharges in response to the DIFF signal swings. The positive feedback provided by the output signal can overcome noise interferences of the $V_{IN}$ or $V_{REF}$ signals when the signal difference is small to maintain signal integrity at the switching point. If $V_{IN}$ is a periodic signal, such as a clock signal, the capacitance of the capacitor 306 is preferably chosen so that it charges from and discharges into the amplifier 302 over a duration that is less than one-half period of a periodic signal.

Figure 4:
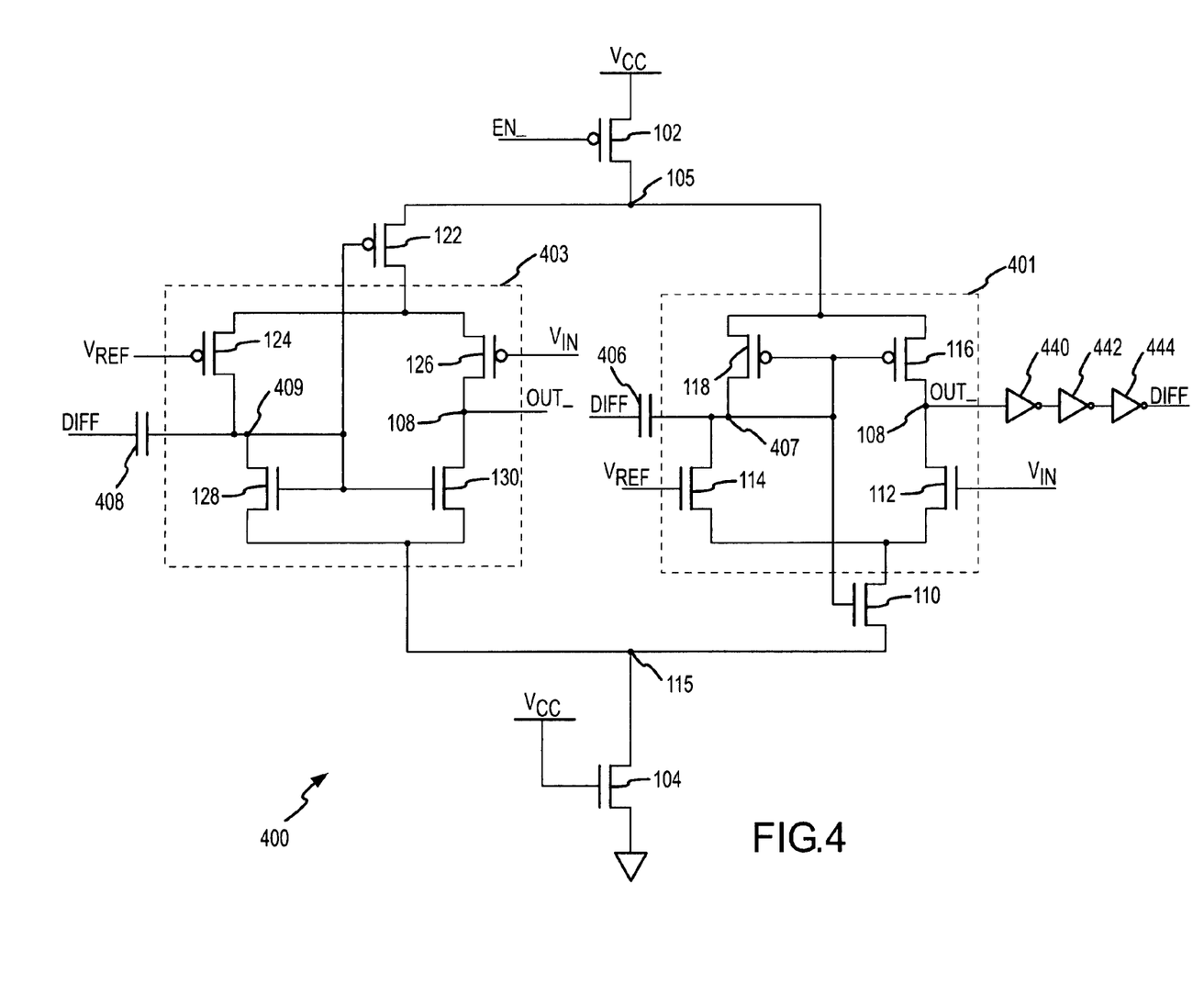
FIG. 4 is a schematic diagram illustrating one embodiment of the differential input buffer circuit of FIG. 3.

A differential input buffer 400 according to one embodiment of the invention is shown in FIG. 4. Similar to the amplifiers 101, 103 of the buffer 100 (FIG. 1), the buffer 400 includes two differential amplifiers 401, 403 whose components are essentially the same, but are complementary configured with respect to each other. The buffer 400 includes many of the same components as the buffer 100 operating in the same manner and, in the interest of brevity, these same components will not be described in detail.

The buffer 400 differs from the conventional buffer 100 shown in FIG. 1 in two respects. Most significantly, as explained in greater detail below, the buffer 400 receives AC positive feedback that makes it more immune to false switching resulting from noise. Second the buffer 400 includes three inverters 440, 442, 444 coupled to the node 108 to invert the OUT_signal and to provide a low impedance to the output at the node 108. The use of three inverters 440, 442, 444 provides greater amplification of the OUT_signal so that the DIFF signal transitions high or low to $V_{CC}$ or to zero, respectively, well prior to the OUT_signal completely transitioning low-to-high or high-to-low.

The AC positive feedback mentioned above is provided by applying the DIFF signal at the output of the inverter 444 to the amplifiers 401, 403 through respective third inputs of the amplifiers 401, 403 at respective nodes 407, 409. The DIFF signal is applied to the nodes 407, 409 through respective capacitors 406, 408 to provide AC positive feedback to increase the drive of the OUT_signal at the node 108 as it transitions high or low. The AC positive feedback does not change the $V_{REF}$ trip point, and provides positive feedback for only a small period of time that the DIFF signal is transitioning from one logic level to another. The positive feedback provided as the $V_{IN}$ signal approaches the $V_{REF}$ reference results in a more stable, uniform transition characteristic since it counteracts any input signal slope reversals due to noise. For example, assume the OUT_signal is transitioning low and the DIFF signal is transitioning high in response to the $V_{IN}$ signal transitioning high. The capacitors 406, 408 couple the low-to-high transition of the DIFF signal to the nodes 407, 409 of the amplifiers 401, 403, causing the voltage at the nodes 407, 409 to be driven high. The increased voltage at the node 407 of the amplifier 401 increases the resistance of the PMOS transistor 116, thereby further decreasing the magnitude of the OUT_signal. The increased voltage at the node 409 of the amplifier 403 decreases the resistance of the NMOS transistor 130, thereby also decreasing the magnitude of the OUT_signal. Thus, a rising $V_{IN}$ signal results in a falling OUT_signal and a rising DIFF signal. The rising DIFF signal further decreases the magnitude of the OUT_signal, thereby providing positive feedback during the time that the DIFF signal is rising. The amplifiers 401, 403 respond to a falling $V_{IN}$ signal in the same manner to provide a falling DIFF signal to the nodes 407, 409 that decrease the resistance of the PMOS transistor 116 in the amplifier 401 and increase the resistance of the NMOS transistor 130 in the amplifier 403, thereby further increasing the OUT_signal.

The amount of positive feedback that is provided depends primarily on the size of the capacitor and gain of the amplifier at the nodes 407, 409, and are determined as part of the design parameters for the particular buffer 400. In the ideal case, the AC positive feedback is provided for less than half the clock cycle of the $V_{IN}$ signal. For example, assuming the OUT_signal is pulled down and the DIFF signal is driven high in response to the OUT_signal. The capacitor 406 couples the low-to-high transition of the DIFF signal to the node 407. The capacitor 406 is then discharged as current is drawn from the capacitor 406 by the node 407. The time constant of the capacitor 406 and resistance at the node 407 should be set so that the capacitor 406 is substantially discharged by the time the DIFF signal transitions low.

Figure 5:
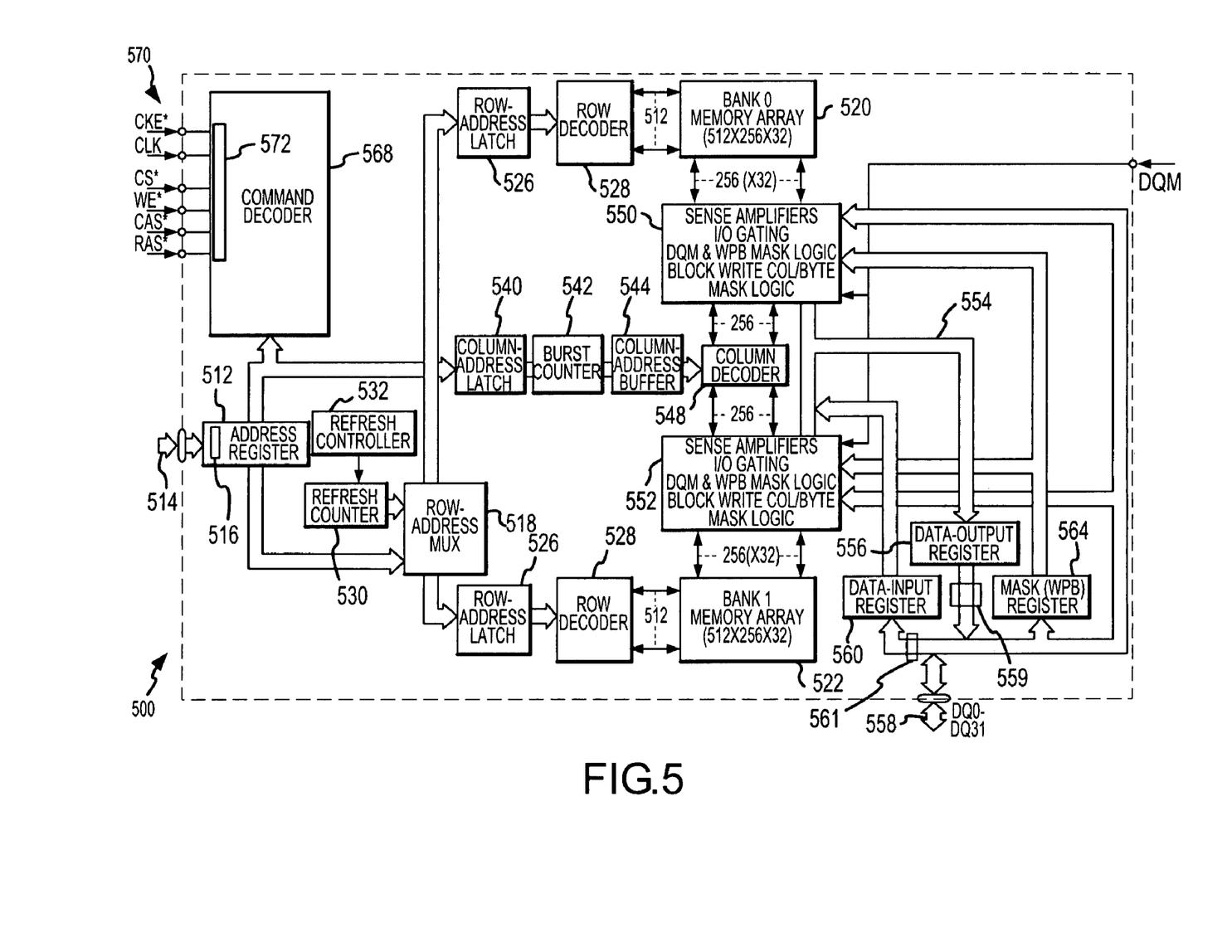
FIG. 5 is a functional block diagram illustrating a memory device that includes at least one differential input buffer circuit according to an embodiment of the invention.

The buffer 400 or another buffer according to an embodiment of the invention is shown in a synchronous dynamic random access memory ("SDRAM") device 500. The SDRAM device 500 includes an address register 512 that receives either a row address or a column address on an address bus 514, preferably by coupling address signals corresponding to the addresses though one embodiment of input buffers 516 according to the present invention. The address bus 514 is generally coupled to a memory controller (not shown). Typically, a row address is initially received by the address register 512 and applied to a row address multiplexer 518. The row address multiplexer 518 couples the row address to a number of components associated with either of two memory banks 520, 522 depending upon the state of a bank address bit forming part of the row address. Associated with each of the memory banks 520, 522 is a respective row address latch 526, which stores the row address, and a row decoder 528, which applies various signals to its respective array 520 or 522 as a function of the stored row address. The row address multiplexer 518 also couples row addresses to the row address latches 526 for the purpose of refreshing the memory cells in the arrays 520, 522. The row addresses are generated for refresh purposes by a refresh counter 530, which is controlled by a refresh controller 532.

After the row address has been applied to the address register 512 and stored in one of the row address latches 526, a column address is applied to the address register 512 and coupled through the input buffers 516. The address register 512 couples the column address to a column address latch 540. Depending on the operating mode of the SDRAM 500, the column address is either coupled through a burst counter 542 to a column address buffer 544, or to the burst counter 542 which applies a sequence of column addresses to the column address buffer 544 starting at the column address output by the address register 512. In either case, the column address buffer 544 applies a column address to a column decoder 548 which applies various signals to respective sense amplifiers and associated column circuitry 550, 552 for the respective arrays 520, 522.

Data to be read from one of the arrays 520, 522 is coupled to the column circuitry 550, 552 for one of the arrays 520, 522, respectively. The data is then coupled through a read data path 554 to a data output register 556. Data from the data output register 556 is coupled to a data bus 558 through data output buffers 559. Data to be written to one of the arrays 520, 522 is coupled from the data bus 558 to a data input register 560 through data input buffers 561 according to an embodiment of the invention. The data input register 560 then couples the write data to the column circuitry 550, 552 where they are transferred to one of the arrays 520, 522, respectively. A mask register 564 may be used to selectively alter the flow of data into and out of the column circuitry 550, 552, such as by selectively masking data to be read from the arrays 520, 522.

The above-described operation of the SDRAM 500 is controlled by a command decoder 568 responsive to command signals received on a control bus 570 though command input buffers 572 according to an embodiment of the invention. These high level command signals, which are typically generated by a memory controller (not shown), are a clock enable signal CKE*, a clock signal CLK, a chip select signal CS*, a write enable signal WE*, a row address strobe signal RAS*, and a column address strobe signal CAS*, which the "*" designating the signal as active low. Various combinations of these signals are registered as respective commands, such as a read command or a write command. The command decoder 568 generates a sequence of control signals responsive to the command signals to carry out the function (e.g., a read or a write) designated by each of the command signals. These command signals, and the manner in which they accomplish their respective functions, are conventional. Therefore, in the interest of brevity, a further explanation of these control signals will be omitted.

Although, the memory device illustrated in FIG. 5 is a synchronous dynamic random access memory ("SDRAM") 500 that includes the buffer 400 according to an embodiment of the invention, the buffer 400 can be used in other types of memory devices, as well as other types of digital devices.

Figure 6:
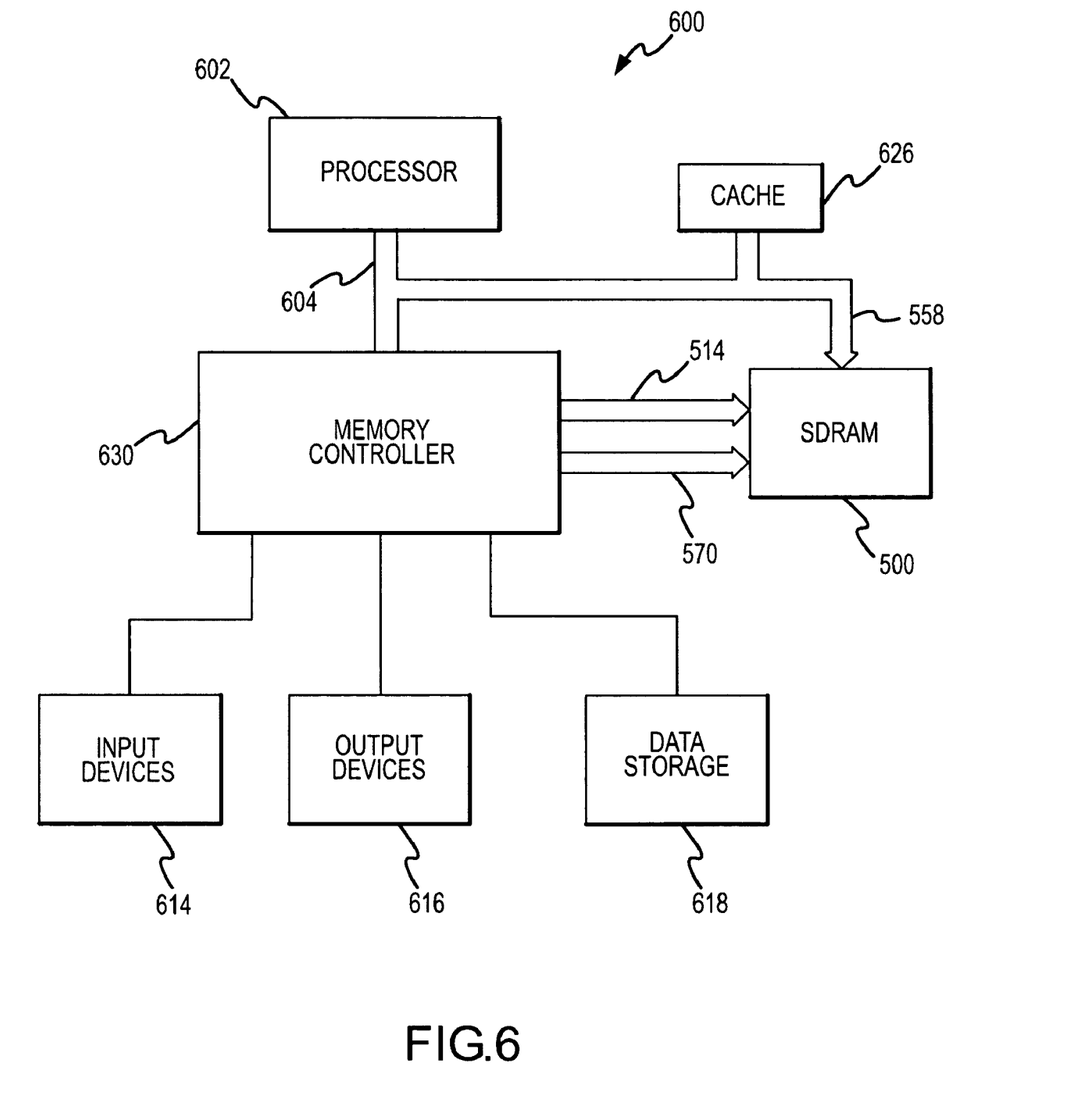
FIG. 6 is a functional block diagram illustrating a computer system including the memory device of FIG. 5.

FIG. 6 shows a computer system 600 containing the SDRAM 500 of FIG. 5. The computer system 600 includes a processor 602 for performing various computing functions, such as executing specific software to perform specific calculations or tasks. The processor 602 includes a processor bus 604 that normally includes an address bus, a control bus, and a data bus. In addition, the computer system 600 includes one or more input devices 614, such as a keyboard or a mouse, coupled to the processor 602 to allow an operator to interface with the computer system 600. Typically, the computer system 600 also includes one or more output devices 616 coupled to the processor 602, such output devices typically being a printer or a video terminal. One or more data storage devices 618 are also typically coupled to the processor 602 to allow the processor 602 to store data in or retrieve data from internal or external storage media (not shown). Examples of typical storage devices 618 include hard and floppy disks, tape cassettes, and compact disk read-only memories (CD-ROMs). The processor 602 is also typically coupled to cache memory 626, which is usually static random access memory ("SRAM"), and to the SDRAM 100 through a memory controller 630. The memory controller 630 is coupled to the SDRAM 500 through the normally control bus 570 and the address bus 514. The data bus 558 is coupled from the SDRAM 500 to the processor bus 604 either directly (as shown), through the memory controller 630, or by some other means.

From the foregoing it will be appreciated that, although specific embodiments of the invention have been described herein for purposes of illustration, various modifications may be made without deviating from the spirit and scope of the invention. For example, many of the components described above may be implemented using either digital or analog circuitry, or a combination of both. Accordingly, the invention is not limited except as by the appended claims.

What is claimed is:

1. An input buffer comprising a comparator circuit having a first input terminal to receive a periodic input signal, a second input terminal to receive a reference signal, the comparator circuit further having an output terminal, the comparator circuit operable to compare the periodic input signal relative to the reference signal and generate an output signal transitioning from a first logic state to a second logic state responsive to the magnitude of the periodic input signal transitioning through the magnitude of the reference signal, the comparator circuit further operable to apply the output signal to a feedback terminal of the comparator to strengthen the transition of the output signal only while the output signal transitions from the first logic state to the second logic state.

2. The input buffer of claim 1 further comprising:
an inverter circuit having an input terminal coupled to the output terminal of the comparator circuit to receive the output signal at the input terminal, the inverter circuit operable to invert the output signal at an output terminal; and a capacitor coupling the output terminal of the inverter to the feedback terminal of the comparator circuit, the capacitor being operable to provide AC positive feedback.

3. The input buffer of claim 2 wherein the inverter circuit comprises three inverters coupled in series.

4. The input buffer of claim 2 wherein the AC positive feedback is substantially present for less than half a clock cycle of the periodic signal.

5. The input buffer of claim 1 wherein the periodic input signal ranges between 0V and a supply voltage $V_{CC}$, and wherein the reference signal is $V_{CC}/2$.

6. The input buffer of claim 1 wherein the output signal is applied to the feedback terminal of the comparator to strengthen the transition of the output signal during the entire period that the output signal is transitioning from the first logic state to the second logic state.

7. The input buffer of claim 1 wherein the feedback terminal of the comparator comprises a terminal that is different from the first and second input terminals.

8. The input buffer of claim 1 wherein the comparator circuit further comprises:
a first differential amplifier having a first NMOS transistor coupled to receive the periodic input signal, a second NMOS transistor coupled to receive the reference signal, a third input node at the drain of the second NMOS transistor coupled to receive the feedback signal, and an output node coupled to the drain of the first NMOS transistor, the first differential amplifier operable in response to receiving the feedback signal at the third node to strengthen the effect of the periodic input signal on the output node; and
a second differential amplifier having a first PMOS transistor coupled to receive the periodic input signal, a second PMOS transistor coupled to receive the reference signal, a third input node at the drain of the second PMOS transistor coupled to receive the feedback signal, and an output node coupled to the drain of the first PMOS transistor, the second differential amplifier operable in response to receiving the feedback signal at the third node to strengthen the effect of the periodic input signal on the output node.

9. The input buffer of claim 8 wherein each of the first and second amplifiers are respectively coupled to a current source that is coupled to a supply voltage and a current sink that is coupled to ground.

10. The input buffer of claim 8 wherein the first differential amplifier is configured to remain operable when the periodic input signal is greater than the threshold voltage of the NMOS transistors, and the second differential amplifier is configured to remain operable when the periodic input signal is less than the threshold voltage of the PMOS transistors.

11. An input buffer comprising:
a comparator circuit having a first input terminal to receive an input signal, a second input terminal to receive a reference signal, a feedback terminal, and an output terminal, the comparator circuit operable to compare the input signal relative to the reference signal and generate at the output terminal an output signal transitioning between a first logic state and a second logic state responsive to the magnitude of the input signal transitioning through the magnitude of the reference signal; and
a capacitor coupling the output terminal to the feedback terminal, the output signal coupled to the feedback terminal being operable to provide positive feedback to the comparator.

12. The input buffer of claim 11 further comprising:
an inverter circuit having an input terminal coupled to the output terminal of the comparator circuit to receive the output signal at the input terminal of the inverter, the inverter circuit operable to invert the output signal at an output terminal; and
wherein the capacitor is coupled between the output terminal of the inverter and the feedback terminal.

13. The input buffer of claim 11 wherein the input signal is a periodic signal.

14. The input buffer of claim 12 wherein the capacitor has a capacitance that causes the positive feedback to be applied to the feedback terminal for a period that is less than half a clock cycle of the periodic signal.

15. The input buffer of claim 11 wherein the feedback terminal of the comparator comprises a terminal that is different from the first and second input terminals.

16. The input buffer of claim 11 wherein the comparator circuit further comprises:
a first differential amplifier having a first NMOS transistor coupled to receive the input signal, a second NMOS transistor coupled to receive the reference signal, and an output node coupled to the drain of the first NMOS transistor, a drain of the second NMOS transistor comprising the feedback terminal, the first differential amplifier operable in response to receiving the output signal at the feedback terminal to strengthen the effect of the input signal on the output node; and
a second differential amplifier having a first PMOS transistor coupled to receive the input signal, a second PMOS transistor coupled to receive the reference signal, and an output node coupled to the drain of the first PMOS transistor, a drain of the second PMOS transistor comprising the feedback terminal, the second differential amplifier operable in response to receiving the output signals at the feedback terminal to strengthen the effect of the input signal on the output node.

17. The input buffer of claim 16 wherein each of the first and second amplifiers are respectively coupled to a current source that is coupled to a supply voltage and a current sink that is coupled to ground.

18. The input buffer of claim 16 wherein the first differential amplifier is configured to remain operable when the input signal is greater than the threshold voltage of the NMOS transistors, and the second differential amplifier is configured to remain operable when the input signal is less than the threshold voltage of the PMOS transistors.

19. A memory device, comprising:
a command decoder receiving memory command signals though externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals;
a data path extending between a plurality of externally accessible data bus terminals and the memory array for coupling write data signals from the externally accessible data bus terminals to the memory array and read data signals from the memory array to the externally accessible data bus terminals; and a plurality of buffers coupled to one of the externally accessible terminals through which at least one of the command signals, address signals, or write data signals are coupled, at least one of the buffers comprising:
a comparator circuit having a first input terminal to receive as an input signal one of the command signals, address signals, or write data signals, a second input terminal to receive a reference signal and a third input terminal to receive a feedback signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to couple the output signal to the third input terminal to strengthen the transition of the output signal only while the output signal transitions from the first logic state to the second logic state.

20. The memory device of claim 19 further comprising:
an inverter circuit having an input terminal coupled to the output terminal of the comparator circuit to receive the output signal at the input terminal, the inverter circuit operable to invert the output signal at an output terminal; and
a capacitor coupling the output terminal of the inverter to the third input terminal of the comparator circuit, the capacitor being operable to provide AC positive feedback.

21. The memory device of claim 20 wherein the inverter circuit comprises three inverters coupled in series.

22. The memory device of claim 19 wherein the input signal is a periodic signal.

23. The memory device of claim 22 wherein the AC positive feedback is substantially present for less than half a clock cycle of the periodic signal.

24. The memory device of claim 19 wherein the input signal ranges between 0V and a supply voltage $V_{CC}$, and wherein the reference signal is $V_{CC}/2$.

25. The memory device of claim 19 wherein the comparator circuit further comprises:
a first differential amplifier having a first NMOS transistor coupled to receive the input signal, a second NMOS transistor coupled to receive the reference signal, a third input node at the drain of the second NMOS transistor coupled to receive the feedback signal, and an output node coupled to the drain of the first NMOS transistor, the first differential amplifier operable in response to receiving the feedback signal at the third node to strengthen the effect of the input signal on the output node;
a second differential amplifier having a first PMOS transistor coupled to receive the input signal, a second PMOS transistor coupled to receive the reference signal, a third input node at the drain of the second PMOS transistor coupled to receive the feedback signal, and an output node coupled to the drain of the first PMOS transistor, the second differential amplifier operable in response to receiving the feedback signal at the third node to strengthen the effect of the input signal on the output node.

26. The memory device of claim 25 wherein each of the first and second amplifiers are respectively coupled to a current source that is coupled to a supply voltage and a current sink that is coupled to ground.

27. The memory device of claim 25 wherein the first differential amplifier is configured to remain operable when the input signal is greater than the threshold voltage of the NMOS transistors, and the second differential amplifier is configured to remain operable when the input signal is less than the threshold voltage of the PMOS transistors.

28. The memory device of claim 19 wherein the output signal is applied to the feedback terminal of the comparator to strengthen the transition of the output signal during the entire period that the output signal is transitioning from the first logic state to the second logic state.

29. The memory device of claim 19 wherein the feedback terminal of the comparator comprises a terminal that is different from the first and second input terminals.

30. A computer system, comprising:
an integrated circuit processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a memory device coupled to a processor bus, the memory device comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals;
a data path extending between a plurality of externally accessible data bus terminals and the memory array for coupling write data signals from the externally accessible data bus terminals to the memory array and read data signals from the memory array to the externally accessible data bus terminals; and
a plurality of buffers coupled to one of the externally accessible terminals through which at least one of the command signals, address signals, read data signals or write data signals are coupled, at least one of the buffers comprising:
a comparator circuit having a first input terminal to receive as an input signal one of the command signals, address signals, or write data signals, a second input terminal to receive a reference signal and a third input terminal to receive a feedback signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to couple the output signal to the third input terminal to strengthen the transition of the output signal only while the output signal transitions from the first logic state to the second logic state.

31. The computer system of claim 30 further comprising:
an inverter circuit having an input terminal coupled to the output terminal of the comparator circuit to receive the output signal at the input terminal, the inverter circuit operable to invert the output signal at an output terminal; and a capacitor coupling the output terminal of the inverter to the third input terminal of the comparator circuit, the capacitor being operable to provide AC positive feedback.

32. The computer system of claim 31 wherein the inverter circuit comprises three inverters coupled in series.

33. The computer system of claim 30 wherein the input signal is a periodic signal.

34. The computer system of claim 30 wherein the AC positive feedback is substantially present for less than half a clock cycle of the periodic signal.

35. The computer system of claim 30 wherein the input signal ranges between 0V and a supply voltage $V_{CC}$, and wherein the reference signal is $V_{CC}/2$.

36. The computer system of claim 30 wherein the comparator circuit further comprises:

a first differential amplifier having a first NMOS transistor coupled to receive the input signal, a second NMOS transistor coupled to receive the reference signal, a third input node at the drain of the second NMOS transistor coupled to receive the feedback signal, and an output node coupled to the drain of the first NMOS transistor, the first differential amplifier operable in response to receiving the feedback signal at the third node to strengthen the effect of the input signal on the output node;

a second differential amplifier having a first PMOS transistor coupled to receive the input signal, a second PMOS transistor coupled to receive the reference signal, a third input node at the drain of the second PMOS transistor coupled to receive the feedback signal, and an output node coupled to the drain of the first PMOS transistor, the second differential amplifier operable in response to receiving the feedback signal at the third node to strengthen the effect of the input signal on the output node.

37. The computer system of claim 36 wherein each of the first and second amplifiers are respectively coupled to a current source that is coupled to a supply voltage and a current sink that is coupled to ground.

38. The computer system of claim 36 wherein the first differential amplifier is configured to remain operable when the input signal is greater than the threshold voltage of the NMOS transistors, and the second differential amplifier is configured to remain operable when the input signal is less than the threshold voltage of the PMOS transistors.

39. The computer system of claim 30 wherein the output signal is applied to the feedback terminal of the comparator to strengthen the transition of the output signal during the entire period that the output signal is transitioning from the first logic state to the second logic state.

40. The computer system of claim 30 wherein the feedback terminal of the comparator comprises a terminal that is different from the first and second input terminals.

41. A method of generating a buffered output signal comprising:

receiving an input signal, and a reference signal;
comparing the input signal and the reference signal;
generating an output signal transitioning from a first logic state to a second logic state responsive to the magnitude of the input signal transitioning through the magnitude of the reference signal; and
using the output signal as positive feedback only during the time that the output signal is transitioning from the first logic state to the second logic state thereby intensifying the transition of the output signal from the first logic state to the second logic state responsive to the positive feedback.

42. The method of claim 41 wherein intensifying the transition of the output signal from the first logic state to the second logic state further comprises capacitively coupling the output signal to provide the positive feedback.

43. The method of claim 42 wherein the capacitively coupled feedback signal is an inverted signal of the output signal.

44. The method of claim 41 wherein the input signal comprises a periodic signal.

45. The method of claim 44 wherein the output signal is used as positive feedback for a time that is less than half a period of the periodic signal.

46. The method of claim 41 wherein the input signal ranges between 0V and a supply voltage $V_{CC}$, and wherein the reference signal is $V_{CC}/2$.

47. An input buffer comprising:

a comparator circuit having a first input terminal to receive an input signal, a second input terminal to receive a reference signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to apply the output signal to a feedback terminal of the comparator to strengthen the transition of the output signal only while the output signal transitions from the first logic state to the second logic state;

an inverter circuit having an input terminal coupled to the output terminal of the comparator circuit to receive the output signal at the input terminal, the inverter circuit operable to invert the output signal at an output terminal; and a capacitor coupling the output terminal of the inverter to the feedback terminal of the comparator circuit, the capacitor being operable to provide AC positive feedback.

48. The input buffer of claim 47 wherein the inverter circuit comprises three inverters coupled in series.

49. An input buffer comprising a comparator circuit having a first input terminal to receive an input signal having input signal having a magnitude that ranges between 0V and a supply voltage $V_{CC}$, a second input terminal to receive a reference signal having a magnitude of $V_{CC}/2$, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to apply the output signal to a feedback terminal of the comparator to strengthen the transition of the output signal only while the output signal transitions from the first logic state to the second logic state.

50. An input buffer comprising a comparator circuit having a first input terminal to receive an input signal, a second input terminal to receive a reference signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to apply the output signal to a feedback terminal of the comparator to strengthen the transition of the output signal during the entire period that the output signal is transitioning from the first logic state to the second logic state.

51. An input buffer comprising a comparator circuit having a first input terminal to receive an input signal, a second input terminal to receive a reference signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to apply the output signal to a feedback terminal of the comparator to strengthen the transition of the output signal only while the output signal transitions from the first logic state to the second logic state, the feedback terminal comprising a terminal that is different from the first and second input terminals.

52. An input buffer comprising a comparator circuit having a first input terminal to receive an input signal, a second input terminal to receive a reference signal, the comparator circuit further having an output terminal, the comparator circuit operable to compare the input signal relative to the reference signal and generate an output signal transitioning from a first logic state to a second logic state responsive to the magnitude of the input signal transitioning through the magnitude of the reference signal, the comparator circuit further operable to apply the output signal to a feedback terminal of the comparator to strengthen the transition of the output signal only while the output signal transitions from the first logic state to the second logic state, the comparator circuit further comprising:

a first differential amplifier having a first NMOS transistor coupled to receive the input signal, a second NMOS transistor coupled to receive the reference signal, a third input node at the drain of the second NMOS transistor coupled to receive the feedback signal, and an output node coupled to the drain of the first NMOS transistor, the first differential amplifier operable in response to receiving the feedback signal at the third node to strengthen the effect of the input signal on the output node; and a second differential amplifier having a first PMOS transistor coupled to receive the input signal, a second PMOS transistor coupled to receive the reference signal, a third input node at the drain of the second PMOS transistor coupled to receive the feedback signal, and an output node coupled to the drain of the first PMOS transistor, the second differential amplifier operable in response to receiving the feedback signal at the third node to strengthen the effect of the input signal on the output node.

53. The input buffer of claim 52 wherein each of the first and second amplifiers are respectively coupled to a current source that is coupled to a supply voltage and a current sink that is coupled to ground.

54. The input buffer of claim 52 wherein the first differential amplifier is configured to remain operable when the input signal is greater than the threshold voltage of the NMOS transistors, and the second differential amplifier is configured to remain operable when the input signal is less than the threshold voltage of the PMOS transistors.

* * * * *

UNITED STATES PATENT AND TRADEMARK OFFICE
CERTIFICATE OF CORRECTION

PATENT NO. : 7,558,125 B2
APPLICATION NO. : 11/639452
DATED : July 7, 2009
INVENTOR(S) : Greg Blodgett It is certified that error appears in the above-identified patent and that said Letters Patent is hereby corrected as shown below:

In column 8, line 51, in Claim 19, delete "though" and insert -- through --, therefor.

Signed and Sealed this

Eighteenth Day of August, 2009

David J. Kappos
*Director of the United States Patent and Trademark Office*